US006720788B2

(12) United States Patent
Colby et al.

(10) Patent No.: US 6,720,788 B2
(45) Date of Patent: Apr. 13, 2004

(54) HIGH RESOLUTION CURRENT MEASUREMENT METHOD

(75) Inventors: David D. Colby, Anna, TX (US); Dale A. Heaton, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/212,500

(22) Filed: Aug. 5, 2002

(65) Prior Publication Data

US 2004/0021478 A1 Feb. 5, 2004

(51) Int. Cl.⁷ .......................... G01R 31/28; G01R 31/26

(52) U.S. Cl. ........................................ 324/765; 324/769

(58) Field of Search ................................ 324/765, 769, 324/763, 760, 158.1, 537

(56) References Cited

U.S. PATENT DOCUMENTS

| | | | | |
|---|---|---|---|---|
| 5,889,408 A | * | 3/1999 | Miller | 324/765 |
| 6,140,832 A | * | 10/2000 | Vu et al. | 324/765 |
| 6,239,609 B1 | * | 5/2001 | Sugasawara et al. | 324/769 |
| 6,242,934 B1 | * | 6/2001 | Kalb, Jr. | 324/765 |

* cited by examiner

*Primary Examiner*—Ernest Karlsen
(74) *Attorney, Agent, or Firm*—Wade James Brady, III; Frederick J. Telecky, Jr.

(57) ABSTRACT

The present invention provides a system and method for high resolution current measurements of an integrated circuit (13). With the present invention, no DFT circuits are required. Leakage current characterizing an integrated circuit is determined for at least one logic state of the integrated circuit from a sum of a first and second current measurement. A voltage source (15) and a current source (17) are used at different settings for each measurement and the measurements are summed for evaluation with an expected value.

14 Claims, 4 Drawing Sheets

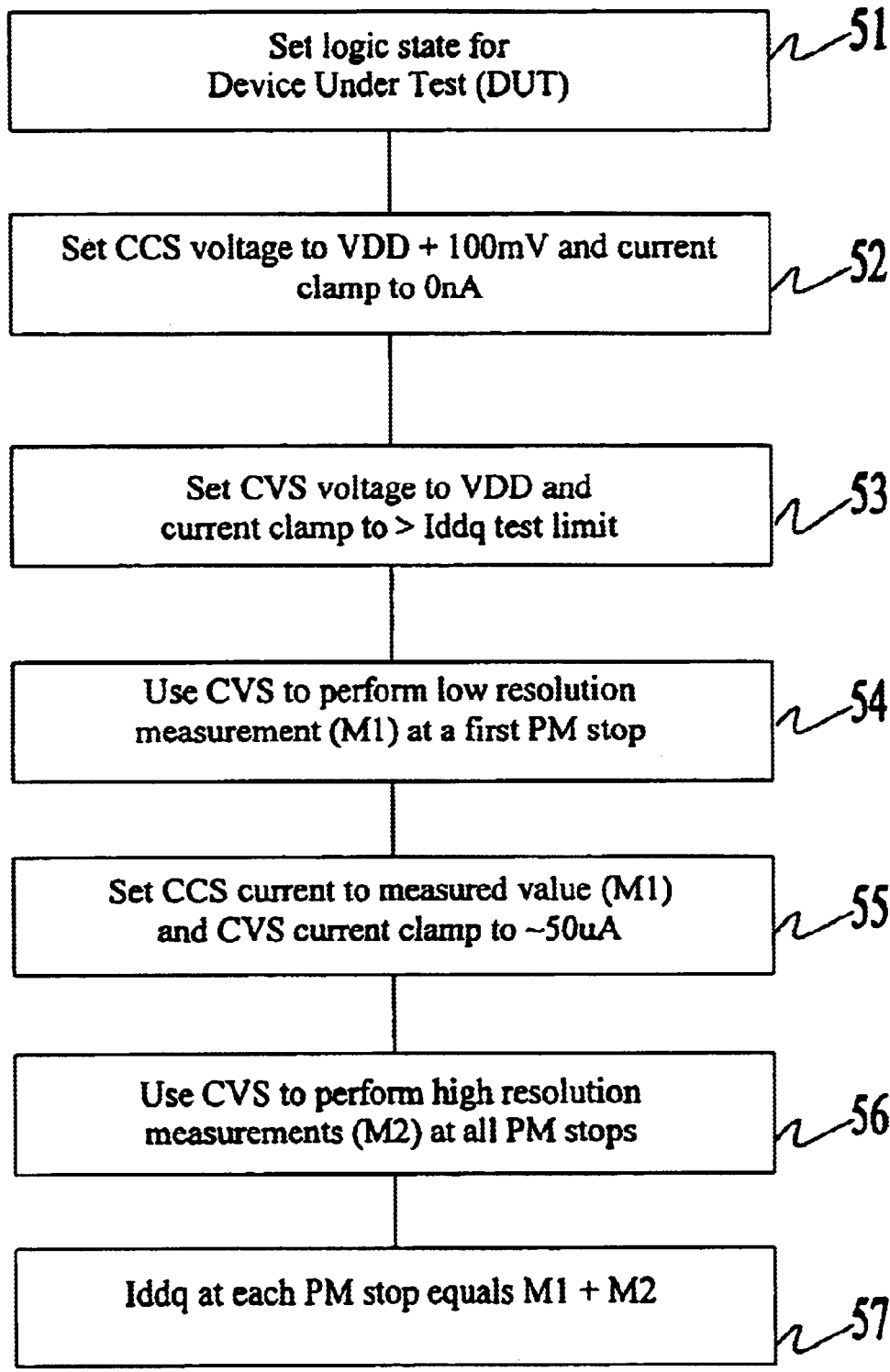

HIGH RESOLUTION CURRENT MEASUREMENT METHOD

BACKGROUND OF THE INVENTION

1. Technical Field of the Invention

The present invention relates generally to integrated circuits and, more particularly, to testing techniques for integrated circuits.

2. Description of the Related Art

A technique known as Iddq testing is often used in defect testing of integrated circuits containing CMOS devices, for example. Iddq is the supply current conducted by a logic device when that device is in a quiescent state. Traditionally, detection of a high leakage current in an integrated circuit pointed to the presence of a defect and a current threshold was established to distinguish a "good device" from a "bad device". More specifically, conventional Iddq testing is performed by an ammeter used to measure the Iddq current of the device under test. However, such conventional testing has become impractical with the increased leakage currents effectuated by the reduction in geometries of each new generation of integrated circuits. Since the "good device" Iddq is increased, with reduced geometry ICs, a small amount of current conducted by a resistive short defect, for example, becomes a very small percentage of the overall current measured (i.e. reduced measurement resolution) making it difficult to effectively distinguish a "good device" from a "bad device". The additional current caused by the resistive short is most often smaller than the accuracy of conventional measurements and smaller than variations in "good device" Iddq from lot to lot.

In attempts to address this problem, most proposed solutions require special design for test (DFT) circuits to be added to the design of the device under test However, these DFT circuits add to the cost of the device while adding no value from the client perspective. For example, one DFT approach divides the power source connections of the device into multiple "power rails" in place of the conventional single power rail. Because each power rail supplies a fraction of the total current of the device, the typical "good device" current for that power sector is smaller than the total for the full circuit. A resistive short can then be more easily detected because it will conduct a larger percentage of the measured current This approach has the disadvantages of requiring more device package pins for power supply connections and requiring extra design effort for power routing. Its purpose is also defeated in typical production testing environments because conventional ATE systems do not provide enough power sources to connect a separate source to each power rail of the device.

Another DFT approach divides the power connections of the device into a "tree structured" power rail with each branch of the tree monitored by a Built-In Current Sensor (BICS). Each BICS is used to measure the current flow through its branch of the power rail. The BICS approach also relies on dividing the total current into smaller measured values so that resistive shorts can be more easily detected. It has the advantage, over the aforementioned DFT approach, that few package pins need be added to the device for test purposes. However, it also has the disadvantage that active test circuitry must be added to the design of the device under test as well as requiring extra design effort to form the tree structured power rails.

SUMMARY OF THE INVENTION

The present invention achieves technical advantages as a system and method for high resolution current measurements of integrated circuits. With the present invention, no DFT circuits are required. That is, no circuitry is added to the device design of a device under test to support the defect testing of the present system and method. Leakage current characterizing an integrated circuit is determined for at least one logic state of the integrated circuit from a sum of a first and second current measurement. A voltage source and a current source are used at different settings for each measurement and the measurements are summed for evaluation with an expected value.

BRIEF DESCRIPTION OF THE DRAWINGS

For a more complete understanding of the present invention, reference is made to the following detailed description taken in conjunction with the accompanying drawings wherein:

FIG. 3 shows flow diagram illustrating a high resolution measurement method in accordance with an exemplary embodiment of the present invention;

DETAILED DESCRIPTION OF THE INVENTION

Figure 1:
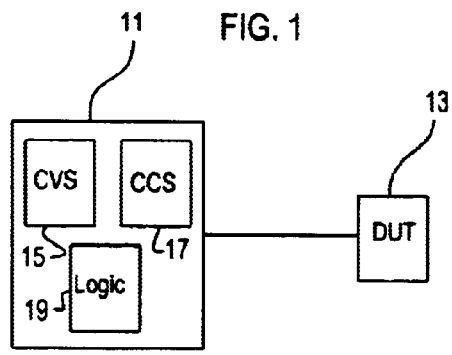
FIG. 1 illustrates a high resolution measurement system in accordance with an exemplary embodiment of the present invention.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others.

Throughout the drawings, it is noted that the same reference numerals or letters will be used to designate like or equivalent elements having the same function. A detailed description of known functions and constructions unnecessarily obscuring the subject matter of the present invention have been omitted for clarity.

Figure 2A:
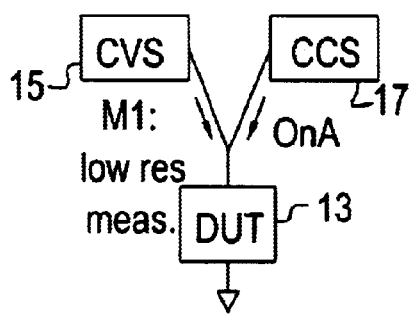
FIG. 2A shows a diagram illustrating an initial measurement at a first PM stop in accordance with an exemplary embodiment of the present invention.

Referring now to FIG. 1 there is illustrated a high resolution measurement system including a test device 11 coupled to a DUT 13 such as a CMOS device, for example. The test device 11 is electrically coupled to the DUT 13 and includes a constant current source 17, a constant voltage source 15 and a logic unit 19. The constant voltage source 15 includes analog to digital conversion (ADC) circuitry enabling current measurement capability by converting the analog current conducted by the DUT 13 to a digital value that can be compared to maximum test limits. The ADC circuitry can be part of or separate from the constant voltage source 15. The power sources and logic unit 19 can be components of conventional automated test equipment (ATE). The logic unit sets the DUT 13 in an quiescent or logic state, via a test pattern signal, that is appropriate for Iddq measurements. Each given logic state to which the DUT 13 is preconditioned before a parameter of the device is measured is hereinafter referred to as a PM stop. PM stops appropriate for Iddq measurements are those that have no node(s) of the logic device at an indeterminable condition and that have only "inactive" current paths from the power source to the ground return. An "inactive" current path is defined as a path for current flow that includes at least one transistor that is turned off, such that only a small leakage current flows through it. Under these PM stop conditions, Iddq is a measurement of the leakage current from the power source to the ground return. The logic unit 19 or conventional ATE can set the DUT 13 in the any number of PM stops at which Iddq is to be measured The constant voltage source 15 is initially set or programmed to a high current range in a low resolution measurement mode. More specifically, the constant voltage source 15 voltage is set to a voltage level referred to in the art as VDD and the maximum output current of the voltage source 15 is set or programmed to clamp at a value slightly greater than the expected Iddq value. The expected Iddq value is a predetermined design calculation which can also be used as a threshold for distinguishing a good device from a bad device. The constant current source 17 is initially set or programmed to source zero amps of current. More specifically, the constant current source 17 voltage is set to VDD plus a small voltage amount, such as 100 mV, and the current clamp to 0 nA. By setting the constant current source 17 to a voltage greater than VDD, current flow from the constant voltage source 15 to the constant current source 17 is prevented so as to not disadvantageously affect the measurements. Subsequently, the constant voltage source 15 is used to determine a low resolution measurement (M1) at a first PM stop. M1 is considered a low resolution measurement here because the constant voltage source 15 is set to a current range large enough to supply the full Iddq level that the DUT 13 is expected to conduct. With a fixed number of binary digits (bits) of the analog-to-digital conversion circuit in the constant voltage source 15, a larger current range results in larger amount of current per bit and thus a lower measurement resolution. A pictorial representation is shown in FIG. 2A.

Following the M1 measurement, the constant current source 17 is set to the measured value of M1. This constant current then supplies the DUT 13 with the power required to maintain its logic state. With no power supplied to the DUT 13 by either the constant voltage source 15 or by the constant current source 17, the DUT 13 would effectively be "turned off". Also, the constant voltage source 15 is set to a low current range of approximately 50 uA, several orders of magnitude lower than the current range used during the M1 measurement. In this lower current range, the amount of "current per bit" of the ADC circuit is significantly reduced, resulting in higher current measurement resolution.

Figure 2B:
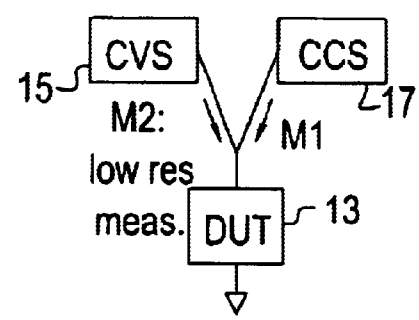
FIG. 2B shows a diagram illustrating a high resolution measurement at each PM stop in accordance with an exemplary embodiment of the present invention.

Here, the constant voltage source 15 is used to perform high resolution measurements (M2) at any or all PM stops. That is, high resolution measurements can be performed at any number of logic states of the DUT 13 as setup by the test system 11. A pictorial representation is shown in FIG. 2B. Due to larger margin of error in the low resolution M1 measurement and due to actual variations in the Iddq values of each PM stop, the M2 values measured at each PM stop will vary and may sometimes be negative. The actual Iddq value at any logic state of the DUT 13 is the sum of the measured values M1 and y for each PM stop. The actual current conducted by the DUT 13 at each PM stop is the algebraic sum of the larger amount of current provided by the constant current source 17 plus any much smaller amount of current provided and measured by the constant voltage source 15. The constant voltage source 15 can include circuitry adapted for summing M1 and M2.

Referring now to FIG. 3 there is shown a flow diagram illustrating a method for high resolution measurement in accordance with an exemplary embodiment of the present invention. Initially, an appropriate logic state is selected and the DUT 13 set for the selected state in step 51. In a subsequent step 52, the constant current source 17 is set to a voltage setting of VDD plus approximately 100 mV and the current clamp is set to a current setting of 0 nA. Also subsequent to step 51, the constant voltage source 15 voltage control is selected to a value of VDD and its current clamp is set to a value greater than the Iddq test limit in step 53. With the aforementioned current and voltage settings, the constant voltage source 15 is used to effectuate a low resolution measurement M1 at a first PM stop at step 54.

Subsequently, the constant current source 17 is set to the M1 measured value and the constant voltage source 15 is set to a low current range (around 50 uA) in a high resolution measurement mode in step 55. Next at step 56, the constant voltage source 15 is used to effectuate high resolution measurements M2. M2 measurement are made at any or all PM stops. That is, high resolution measurements can be performed at any number of logic states of the DUT 13 as set-up by the test system 11 in step 51. Finally, the Iddq at each PM stop is determined by summing of the M1 and M2 measurements. The power sources 15, 17 and logic unit 19 can be programmable devices such that the aforementioned method can be performed automatically for a predetermined number of logic states.

Figure 4:
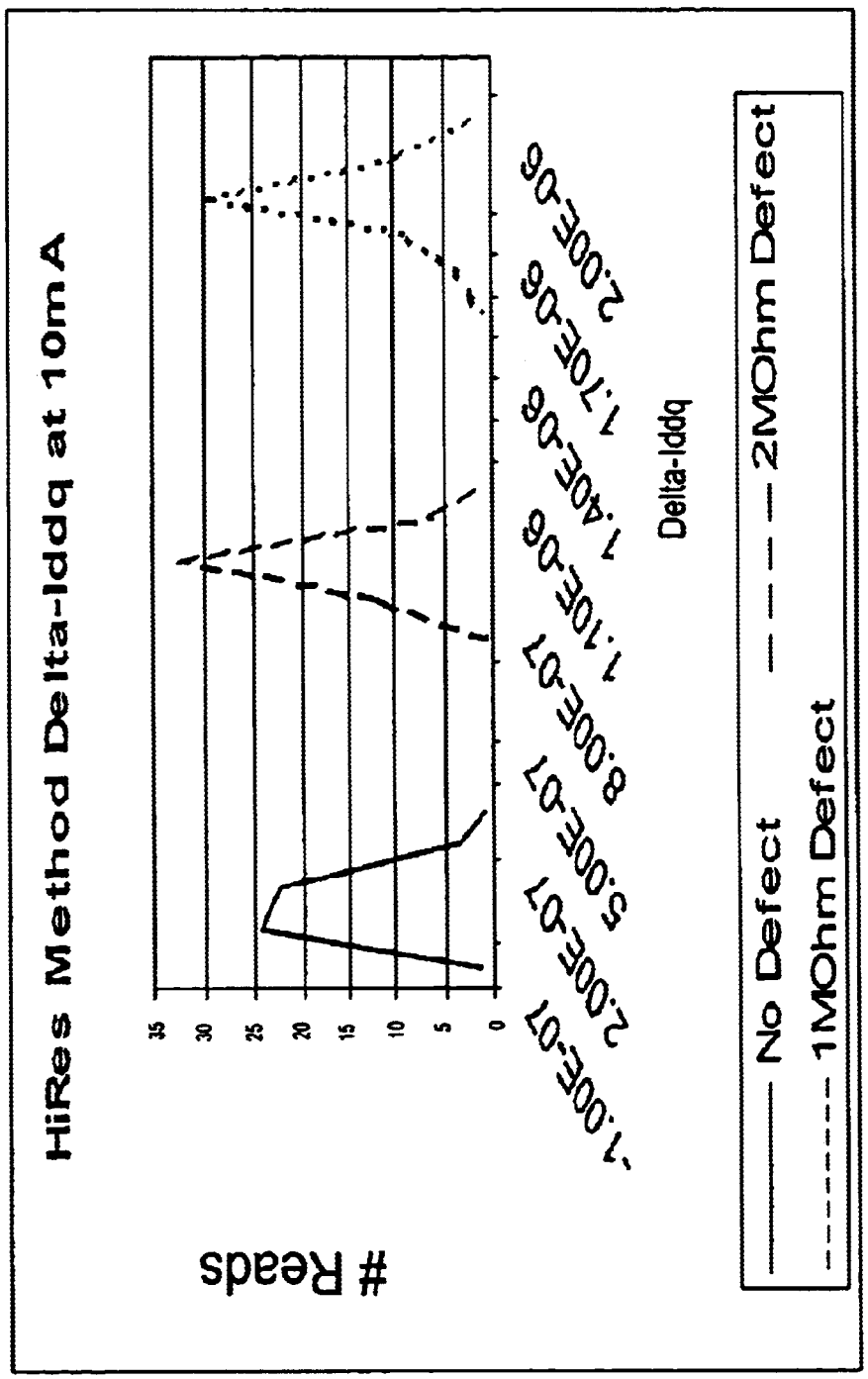
FIG. 4 shows a graph illustrating the distribution of delta-Iddq readings for a simulated test for high resolution measurement in accordance with an exemplary embodiment of the present invention.
Figure 5:
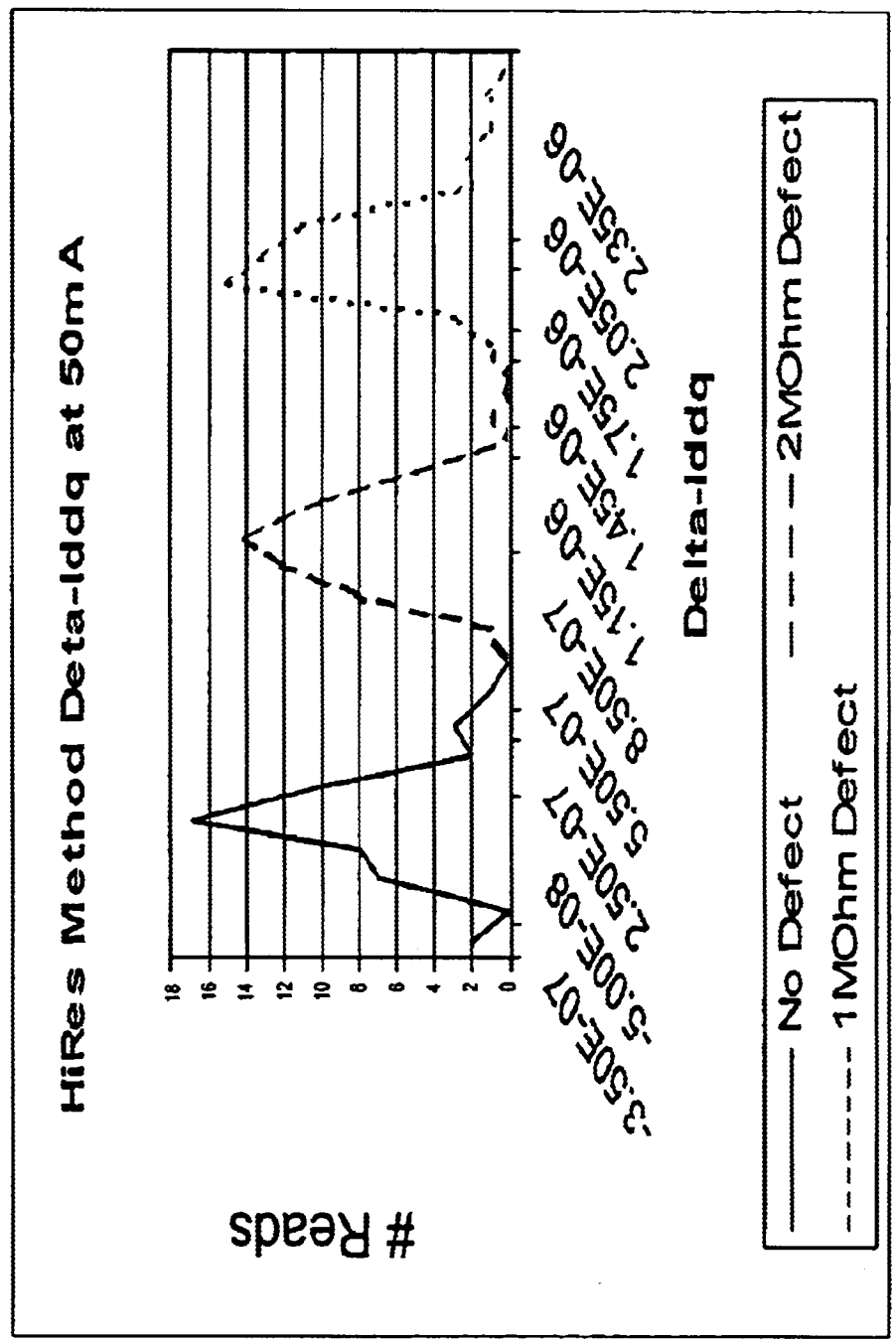
FIG. 5 illustrates shows a graph illustrating the distribution of delta-Iddq readings for another simulated test for high resolution measurement in accordance with an exemplary embodiment of the present invention.

FIGS. 4 and 5 illustrate graphical representations of the distribution of delta-Iddq results from simulated tests in which defects were simulated by placing resistors across a circuit under test. The objective of the graphs is to demonstrate that the distribution of measured Iddq values of good devices does not overlap the distribution of measure Iddq values of defective devices. Referring to FIG. 4, a known good device with an Iddq value of approximately 10 mA was tested 100 times using the present method. Each test comprising of 30 Iddq measurements which were averaged and the delta from 10 mA calculated to produce one data point. The one hundred data points were then plotted to show the expected distribution of measured values. Defective devices were then simulated by connecting 1 MOhm and 2 MOhm resistors in parallel with the known good device and repeating the process. Note that the graph illustrates a tight distribution of data points with no overlapping of good and defective devices. The simulation results shown in FIG. 5 are for a good device current of 50 mA. Again note the tight distribution of data points with no overlapping of good and defective devices.

Although a preferred embodiment of the system and method of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A method for determining leakage current characterizing an integrated circuit; said method comprising:

preconditioning the integrated circuit to a first logic state;

applying a voltage to the integrated circuit via a constant voltage source having current measurement capabilities, wherein said voltage is within the operating voltage range of the integrated circuit;

clamping a current from said constant voltage source to a value greater than the expected leakage current of the integrated circuit;

applying a current clamp of approximately zero amperes to the integrated circuit via a constant current source, wherein a voltage of said constant current source is set to an amount greater than said constant voltage source voltage;

determining a first current measurement via said constant voltage source;

subsequently adjusting said constant current source current clamp to said first current measurement and said constant voltage source current clamp to an amount at least two orders of magnitude lower than the expected leakage current of the integrated circuit;

determining a second current measurement via constant voltage source; and summing said first current measurement and said second current measurement.

2. The method of claim 1 further including repeating said steps for a second logic state.

3. The method of claim 1, wherein said constant current source voltage is selected to approximately 100 mV greater than said constant voltage source voltage.

4. The method of claim 1, wherein said subsequent adjusted constant voltage source current clamp is selected to approximately 50 uA.

5. A system for determining leakage current characterizing an integrated circuit, comprising:

a constant voltage source coupled to the integrated circuit and adapted to supply a selectable current to the integrated circuit and adapted to supply the integrated circuit operating voltage;

a constant current source coupled to the integrated circuit and adapted to supply a selectable current to the integrated circuit and a voltage approximately that of the operating voltage of the integrated circuit;

a measurement unit coupled to the integrated circuit and adapted to sense the current conducted by the integrated circuit in a first and second measurement, wherein in the first measurement said constant voltage source current is selected to a value greater than the expected leakage current of the integrated circuit and said constant current source current is selected to a value of approximately zero amperes, and wherein in the second measurement said constant voltage source current is selected to a value at least two orders of magnitude less than the expected leakage current of the integrated circuit and said constant current source current is selected to the value of the first measurement, the sum of the first and second measurements is the leakage current characterizing an integrated circuit.

6. The system of claim 5, wherein said measurement unit is farther adapted to sum said first and said second measurement results.

7. The system of claim 5 further including a logic unit coupled to the integrated circuit and adapted to precondition the integrated circuit to a plurality of logic states, wherein said first and second measurements are made at each of said logic states.

8. The system of claim 5, wherein said measurement unit further includes analog to digital circuitry adapted to convert the sensed current from an analog value to a digital value.

9. A method for defect detection in an integrated circuit, comprising:

applying a voltage to the integrated circuit via a constant voltage source, wherein said voltage is within the operating voltage range of the integrated circuit;

clamping a current from said constant voltage source to a value approximately equal to a predetermined leakage current of the integrated circuit;

applying a current clamp of approximately zero amperes to the integrated circuit via a constant current source, wherein a voltage of said constant current source is set to an amount greater than said constant voltage source voltage;

determining a first current measurement via said constant voltage source;

subsequently adjusting said constant current source current clamp to said first current measurement and said constant voltage source current clamp to an amount at least two orders of magnitude lower than the threshold leakage current of the integrated circuit;

determining a second current measurement via constant voltage source; and evaluating a sum of said first current measurement and said second current measurement to the threshold.

10. The method of claim 9 further including preconditioning the integrated circuit to a plurality of logic states, wherein said first and second current measurements are made for each logic state.

11. The method of claim 9, wherein said constant current source voltage is selected to approximately 100 mV greater than said constant voltage source voltage.

12. The method of claim 9, wherein a sum of said first and second current measurements greater than the threshold determines a defect.

13. The method of claim 9, wherein said first and second current measurements are sensed as analog values and are converted to digital values.

14. The method of claim 9, wherein said subsequently adjusted constant voltage source current clamp is selected to approximately 50 uA.

* * * * *